(12) United States Patent
Torii

(10) Patent No.: US 11,916,137 B2
(45) Date of Patent: Feb. 27, 2024

(54) SEMICONDUCTOR DEVICE

(71) Applicant: SANKEN ELECTRIC CO., LTD., Niiza (JP)

(72) Inventor: Katsuyuki Torii, Tokyo (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 255 days.

(21) Appl. No.: 17/511,926

(22) Filed: Oct. 27, 2021

(65) Prior Publication Data
US 2023/0131819 A1  Apr. 27, 2023

(51) Int. Cl.
*H01L 29/739* (2006.01)
*H01L 49/02* (2006.01)

(52) U.S. Cl.
CPC .......... *H01L 29/7397* (2013.01); *H01L 28/20* (2013.01)

(58) Field of Classification Search
CPC ............................ H01L 29/7397; H01L 28/20
USPC ....................................................... 257/139
See application file for complete search history.

(56) References Cited

U.S. PATENT DOCUMENTS

| 2014/0209972 A1 | 7/2014 | Sumitomo et al. |
| 2015/0129927 A1* | 5/2015 | Sumitomo .......... H01L 29/0839 257/139 |
| 2023/0163760 A1* | 5/2023 | Torii ................... H01L 29/7397 257/139 |

FOREIGN PATENT DOCUMENTS

JP   2013-98415 A   5/2013

* cited by examiner

*Primary Examiner* — Igwe U Anya
(74) *Attorney, Agent, or Firm* — METROLEX IP LAW GROUP, PLLC

(57) ABSTRACT

A semiconductor device may include: a drift region of a first conductivity type; a base region of a second conductivity type arranged on the drift region; an emitter region of the first conductivity type arranged on the base region; a field stop region of the first conductivity type arranged in contact with the drift region; a collector region of the second conductivity type in contact with the field stop region; a main gate electrode electrically insulated from the base region and the collector region; a control gate electrode electrically insulated from the base region and the collector region; a gate pad on the drift region; a first resistor electrically connected between the gate pad and the main gate electrode; and a second resistor electrically connected between the gate pad and the control gate electrode. A resistance value of the first resistor may be greater than the second resistor thereof.

6 Claims, 4 Drawing Sheets

A-A

B-B

SEMICONDUCTOR DEVICE

BACKGROUND

In power semiconductor device technology, IGBTs (Insulated Gate Bipolar Transistor) are capable of low ON voltage by the effect of conductivity modulation, but a tail current flow might be a problematic since tail current continues to flow until a residual carrier at the time of conductivity modulation disappears when turning off. This makes it difficult to achieve a fast switching operation. As a countermeasure to reduce the tail current, it has been known to introduce a crystal defect in a drift region and capture a residual carrier by the carrier trap effect. However, a leakage current increases due to the introduction of a crystal defect in this method.

Japanese Patent Publication 2013-98415 (Patent Document 1) proposes a method of dividing gate electrodes of an IGBT into a control gate and a normal gate and inputting OFF signals of different timing to each of the gate electrodes (control gate and normal gate) as a countermeasure against the tail current. In a semiconductor device of Patent Document 1, the control gate is first turned off before the normal gate is turned off, and the hole carrier density at the time of conductivity modulation of the semiconductor device is made lower than that of the conventional semiconductor device. After that, the normal gate is turned off. As a result, the residual hole carrier density, which causes the tail current immediately after the normal gate is turned off, can be lowered compared with the conventional method, and therefore, an IGBT, which is turned off with high speed, can be achieved.

In this case, however, not only the IGBT needs to be changed, but also it might be necessary to have a function to output independent gate signals with different timing to a control circuit, such as an IC. The conventional simple control circuit also needs to have significant changes and additional functions.

SUMMARY

A semiconductor device according to one or more embodiments may include: a drift region of a first conductivity type; a base region of a second conductivity type arranged on the drift region; an emitter region of the first conductivity type arranged on the base region; a field stop region of the first conductivity type arranged in contact with the drift region; a collector region of the second conductivity type provided in contact with the field stop region; a main gate electrode electrically insulated from the base region and the collector region; a control gate electrode electrically insulated from the base region and the collector region; a gate pad provided on the drift region; a first resistor electrically connected between the gate pad and the main gate electrode; and a second resistor electrically connected between the gate pad and the control gate electrode. In one or more embodiments, a resistance value of the first resistor may be greater than the resistance value of the second resistor.

BRIEF DESCRIPTION OF DRAWINGS

FIG. 1 is a diagram illustrating a semiconductor device according to one or more embodiments of;

DETAILED DESCRIPTION

Figure 1:
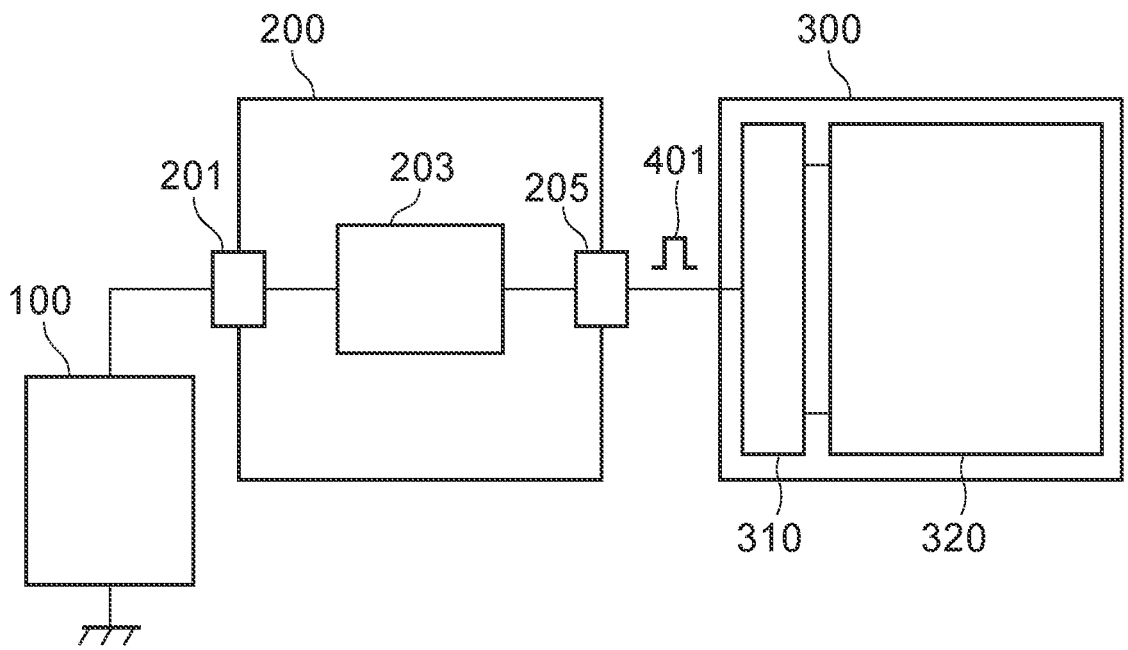

One or more embodiments are described in detail with reference to drawings. In the following descriptions of drawings, the same or similar parts may be indicated by the same or similar indications. The descriptions of drawings are schematic, and the relationship between thickness and dimensions, the ratio of thickness of each layer, etc. are examples and do not limit the technical concept of the invention. The relationship between dimensions and the ratio of dimensions may differ from each other among the drawings. The following embodiments explains a condition where exemplary a first conductivity type is n-type and a second conductivity type is p-type, but it may be possible to select the conductivity types in the opposite relationship, where the first conductivity type is p-type, and the second conductivity type is n-type. In the following descriptions when explaining the positional relationship of components, "top", "bottom", "right side", "left side", etc. are used as necessary based on an orientation of the referenced drawing, but these indications do not limit the technical concept of the invention. "Top", "bottom", "right side", "left side", etc. may be used without the parts touching each other. The X-axis, Y-axis, or Z-axis may be used in the drawings to explain directions. In diagrams, the "width direction" may mean the X direction or the direction opposite to the X direction in the figure. The "depth direction" or "lower side" may mean the Y direction illustrated in the figure. The "shallow direction" or "upper side" may mean the direction opposite to the Y direction illustrated in the figure. The "longitudinal direction" may mean the Z direction or the direction opposite to the Z direction illustrated in the figure.

FIG. 1 is a diagram illustrating a semiconductor device according to one or more embodiment. FIG. 1 illustrates a power supply 100, a drive circuit 200 that inputs a predetermined voltage from the power supply 100, and an IGBT circuit 300 that inputs a control signal output from the drive circuit 200. The power supply 100 supplies a predetermined voltage to the drive circuit 200. There is no restriction on the voltage supplied, and for example, an input voltage of 15V may be used. The drive circuit 200 includes a gate control signal generator 203. The drive circuit 200 may also include a voltage input pad 201 and a gate control signal output pad 205. The power supply 100 is connected to the voltage input pad 201 and supplies an input voltage to the voltage input pad 201. The gate control signal generator 203 detects the voltage supplied to the voltage input pad 201 and generates a gate control signal 401. The gate control signal 401 is a signal for controlling the gate of the IGBT circuit 300. The generated gate control signal 401 is output from the gate control signal output pad 205. The IGBT circuit 300 includes a resistor section 310 and an active region 320. The resistor section 310 receives the gate control signal 401 generated by the gate control signal generator 203. In FIG. 1, an electrical connection is made from the resistor section 310 to the active region 320 by two bus lines, but this is not limited thereto. The resistor section 310 may be provided in an inactive part of the semiconductor device. Traditionally, a semiconductor device includes an active region in which various elements are formed and an inactive region provided on the peripheries of the active region. The drive circuit 200 and the IGBT circuit 300 may be mounted on one lead-frame or may be mounted on separate lead-frame.

Figure 2:
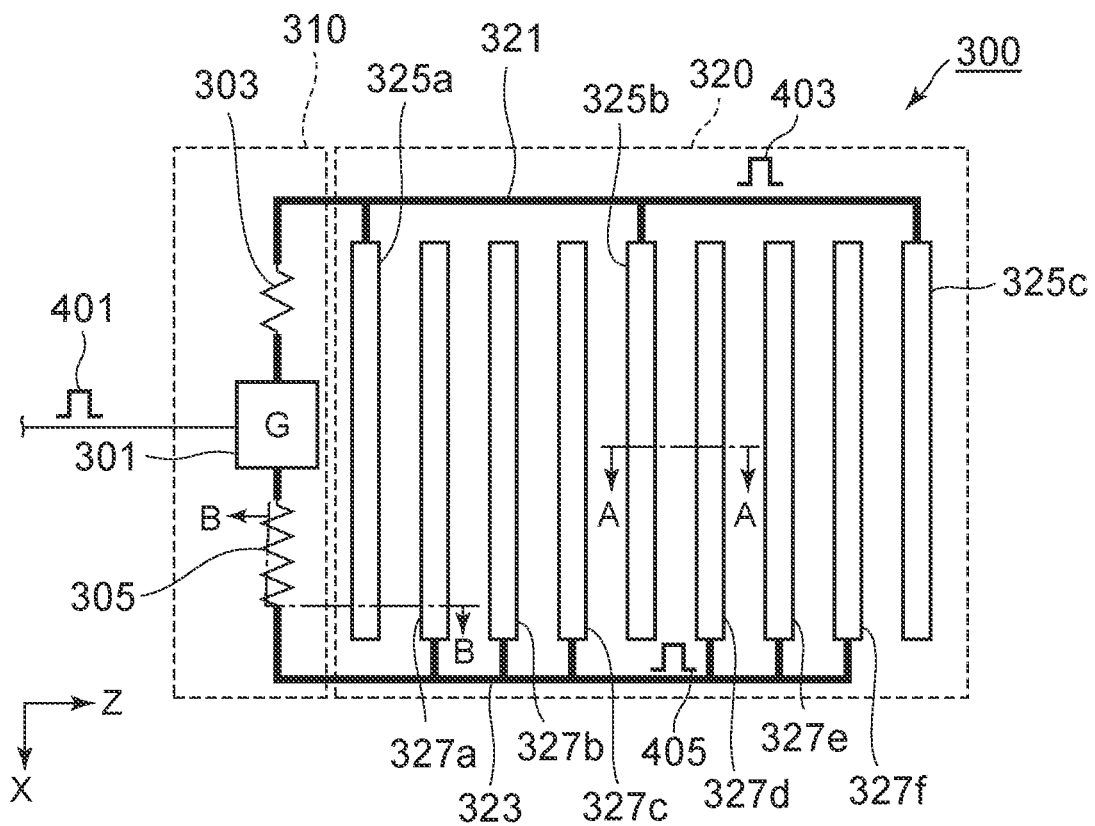
FIG. 2 is a diagram illustrating an IGBT circuit 300 according to one or more embodiments.

FIG. 2 is a diagram illustrating the IGBT circuit 300 according to one or more embodiments. The IGBT circuit 300 includes the resistor section 310 and the active region 320. The resistor section 310 receives the gate control signal 401 from the drive circuit 200 (not illustrated in FIG. 2). The resistor section 310 may include a gate pad 301. The resistor section 310 electrically connects the drive circuit 200 (not illustrated in FIG. 2) and the gate pad 301. The resistor section 310 includes a resistor 303 and a resistor 305. The resistor 303 and the resistor 305 may be formed on a surface side of a semiconductor substrate by a bus line formed with polysilicon in a trench in which an S-shape is formed many times in a plan view. The resistor 303 and the resistor 305 comprise a first terminal and a second terminal. The first terminals of the resistor 303 and the resistor 305 are electrically connected with the gate pad 301. The second terminal of the resistor 303 is electrically connected with the gate electrode (control gate) 325*a*, 325*b*, and 325*c* of the first type IGBT through the gate bus line 321. The second terminal of the resistor 305 is electrically connected with the gate electrode (main gate) 327*a*, 327*b*, 327*c*, 327*d*, 327*e*, and 327*f* of the second type the IGBT through the gate bus line 323.

The active region 320 includes the first type IGBT that includes control gates 325*a*, 325*b*, and 325*c*, and the second type IGBT that includes main gates 327*a*, 327*b*, 327*c*, 327*d*, 327*e*, and 327*f*. Each of the control gates 325*a*, 325*b*, and 325*c* is included in a first type IGBT provided in the active region 320. Each of the main gates 327*a*, 327*b*, 327*c*, 327*d*, 327*e*, and 327*f* is included in a second type IGBT provided in the active region 320. The control gates 325*a*, 325*b*, and 325*c* are electrically connected to the resistor 303 by the control gate bus line 321. The main gates 327*a*, 327*b*, 327*c*, 327*d*, 327*e*, and 327*f* are electrically connected to the resistor 305 by the main gate bus line 323.

For example, resistance values of the resistor 303 and the resistor 305 may be made different. For example, the resistor 303 and the resistor 305 having different resistance values from the resistance value of the gate bus line may be provided in an area of the gate pad 301, the control gate bus line 321, and the main gate bus line 323. In response to the gate control signal 401 changing to the turn off signal, discharge current flows from the control gates 325*a*, 325*b*, and 325*c* and the main gates 327*a*, 327*b*, 327*c*, 327*d*, 327*e*, and 327*f*. The discharge time varies depending on the resistance value from the gate pad 301 to each of the control gates 325*a*, 325*b*, and 325*c* and the main gates 327*a*, 327*b*, 327*c*, 327*d*, 327*e*, and 327*f*. Therefore, for example, when the resistance value of the resistor 303 is small, the discharge on the side of the resistor 303 becomes faster, and the cell of the IGBT on the side connected to the resistor 303 becomes the off-state first. For example, the discharge time of the first type IGBT is shorter than the discharge time of the second type IGBT. Then, with a single gate control signal 401, the same effect as in Patent Document 1, where the first type IGBT is turned off before the second type IGBT, may be obtained. The drive circuit 200 may use an existing circuit. Since the IGBT circuit 300 has only one gate pad, the IGBT circuit 300 may be easily manufactured and may be incorporated under existing conditions in the assembly process.

As in the IGBT circuit 300 illustrated in FIG. 2, the number of main gates 327 may be more than the number of control gates 325. The IGBT cell with the control gates 325 and the IGBT cell with the main gates 327 may be arranged alternately, and an IGBT cell with the main gates 327 may be provided between the IGBT cell with the control gates 325 and the IGBT cell with the control gates 325. For example, as illustrated in FIG. 2, three IGBT cells with the main gates 327*a*, 327*b*, and 327*c* may be positioned between the IGBT cell with the control gate 325*a* and the IGBT cell with the control gate 325*b*. However, it is not limited thereto, two, four, five, six, seven, etc. of the IGBT cell with main gates may be positioned between the IGBT cell with a control gate and the IGBT cell with a control gate. The resistor section 310 may be provided in an inactive region of the IGBT circuit 300. A breakdown voltage improvement region (not illustrated in FIG. 2) may be arranged outside the active region 320, the gate pad 301, the control gate bus line 321, the main gate bus line 323, the resistor 303 and the resistor 305.

Figure 3:
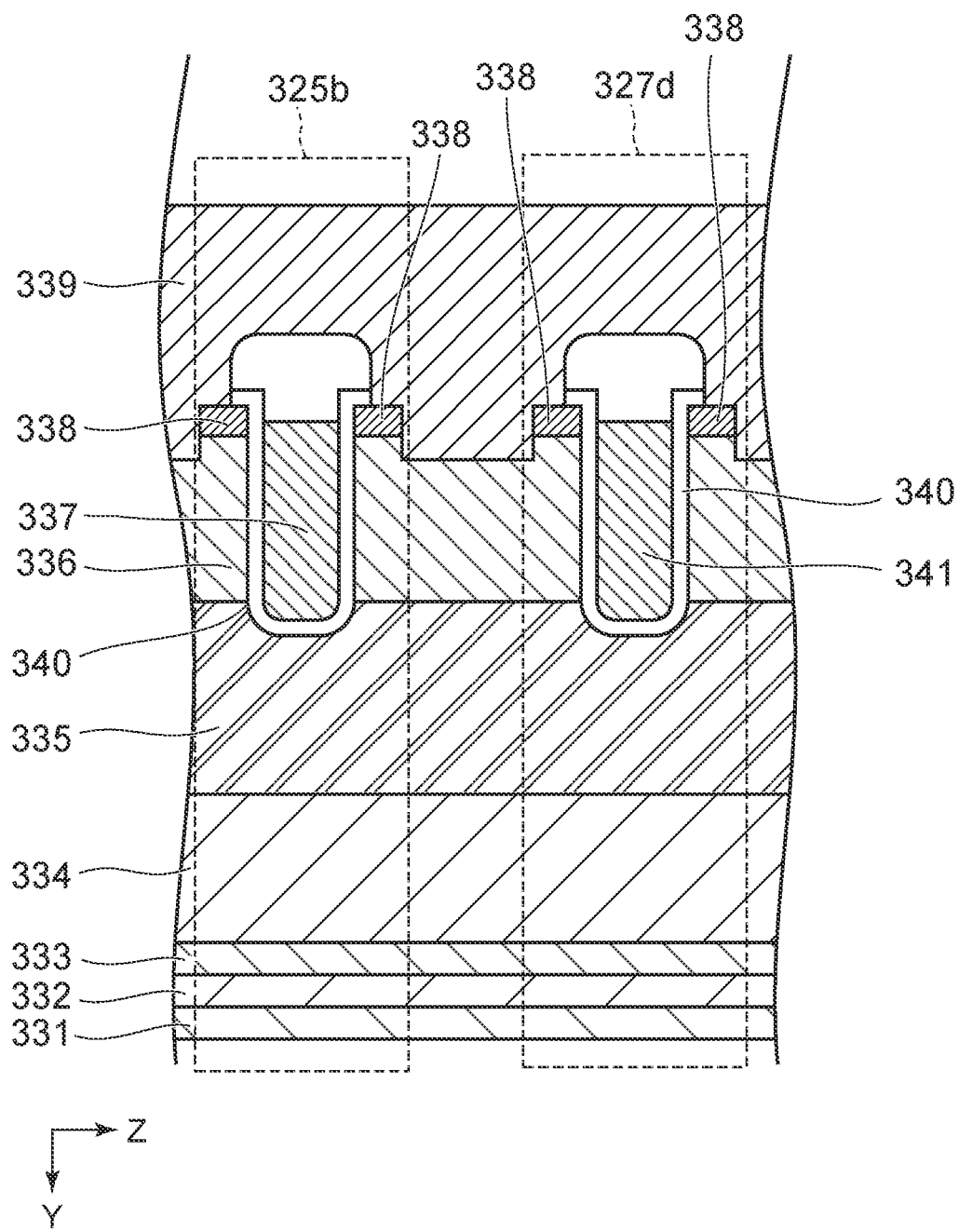
FIG. 3 is a diagram illustrating an A-A cross-sectional view of the IGBT circuit 300, such as illustrated in FIG. 2.

FIG. 3 is a diagram illustrating an A-A cross-sectional view of the IGBT circuit 300 illustrated in FIG. 2, for example. In FIG. 3, the IGBT circuit 300 includes a collector electrode 331, a collector region 332 which is positioned on the collector electrode 331 and is electrically connected to the collector electrode 331, a field stop region 333 positioned on the collector region 332, a drift region 334 positioned on the field stop region 333, a storage carrier layer 335 positioned on the drift region 334, a base region 336 positioned on the storage carrier layer 335, emitter regions 338 provided in contact with the base region 336, an emitter electrode 339 which is positioned on the emitter regions 338 and is electrically connected to the emitter regions 338. the control gate 325*b* is insulated from the emitter regions 338, the base region 336, and the storage carrier layer 335 by the gate insulating film 340. The main gate 327*b* is also insulated from the emitter regions 338, the base region 336, and the storage carrier layer 335 by the gate insulating film 340. The field stop region 333, the drift region 334, the storage carrier layer 335, and the emitter electrode 339 may be a first conductivity type. The impurity concentration of the storage carrier layer 335 may be higher than that of the drift region 334. In FIG. 3, the storage carrier layer 335 is provided, but the storage carrier layer 335 may not be provided. In this case, the impurity concentration of the region corresponding to the storage carrier layer 335 may be equal to the impurity concentration of the drift region 334. The field stop region 333 may have a higher impurity concentration than the storage carrier layer 335. The collector region 332 and the base region 336 may be a second conductivity type. The control gate electrode 337 and the main gate electrode 341 are provided inside a trench provided in the depth direction of the IGBT circuit 300 and are sandwiched between the emitter regions 338. In FIG. 3, the IGBT cells with the control gate electrode 337 and the main gate electrode 341 may have different characteristics and structures. For example, in FIG. 3, the control gate electrode 337 and the main gate electrode 341 have the same depth, but are not limited thereto. The thickness of the gate insulating film 340 that insulates the control gate electrode 337 may be different from the thickness of the gate insulating film 340 that insulates the main gate electrode 341.

Figure 4:
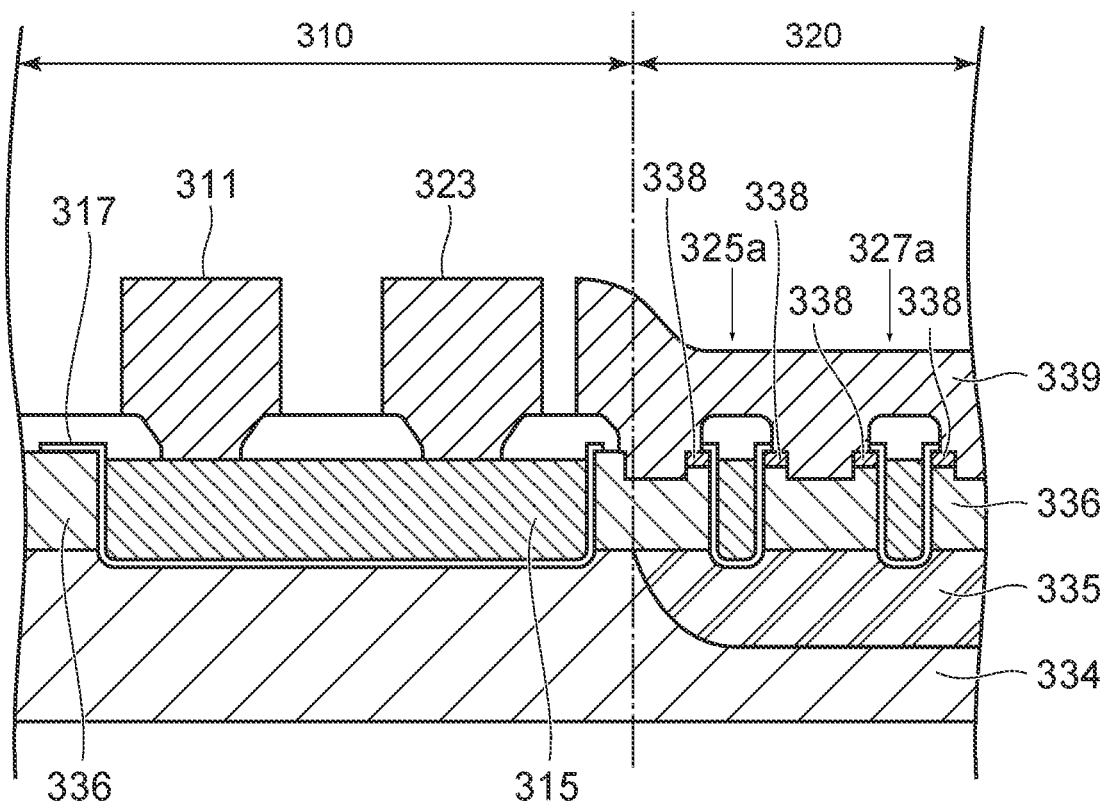
FIG. 4 is a diagram illustrating a B-B cross-sectional view of FIG. 2.
Figure 5:
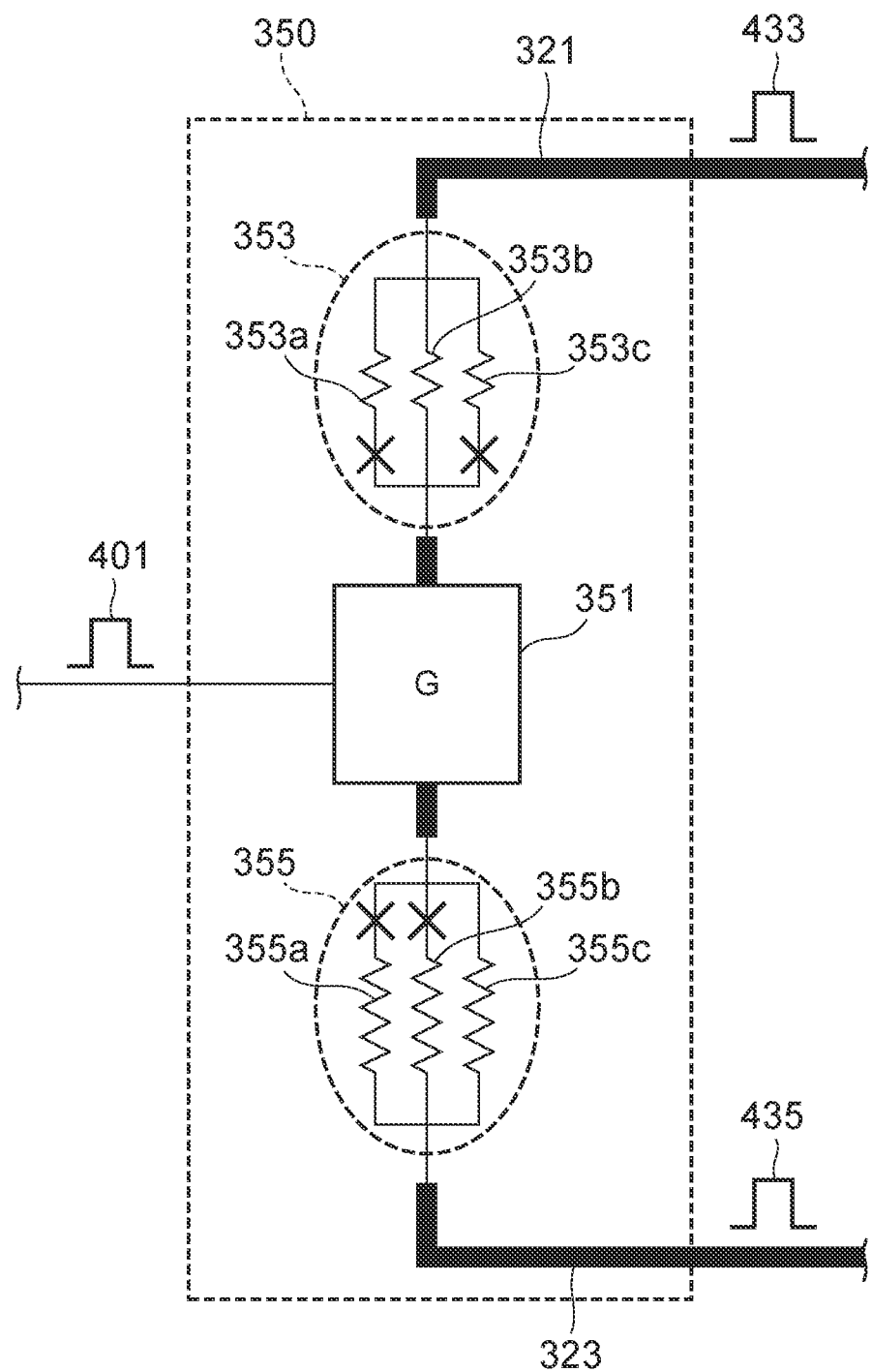
FIG. 5 is a diagram illustrating a resistor section 350 according to one or more embodiments.

FIG. 4 is a diagram illustrating a B-B cross-sectional view of FIG. 2. In FIG. 4, the field stop region 333 (not illustrated in FIG. 4) and the layers below the field stop region 333 are omitted. The resistor section 310 includes a bus line 311 electrically connected to the gate pad 301 (not illustrated in FIG. 4), a polysilicon resistor 315 formed in a trench, an insulating film 317 insulating the polysilicon resistor 315 from the outside, and the main gate bus line 323 electrically connected to the polysilicon resistor 315. The polysilicon resistor 315 may have a higher resistance value than the bus line 311, the main gate bus line 323, and the main gate electrode 341. The resistor 305 in FIG. 2 may include the polysilicon resistor 315. In FIG. 5, a well-known breakdown voltage improvement region, such as a field limited ring (FLR), may be provided on the substrate edge side (left side of FIG. 4), which is the opposite side of the active region 320 as seen from the resistor section 310. The gate pad 301 is connected to the main gate 327a via the resistor 305. A similar configuration may be included for the resistor 303.

An operation of a semiconductor device according to one or more embodiments are described. First, a predetermined voltage is input to the drive circuit 200 from the power supply 100. The gate control signal generator 203 generates a gate control signal and outputs the gate control signal to the IGBT circuit 300. The resistor section 310 of the IGBT circuit 300 generates the control gate control signal and the main gate control signal. Since the discharge current values from the resistor 303 and the resistor 305 differ according to the resistance value, the discharge on the resistor 303 side with a small resistance value becomes faster, and the IGBT cell with the control gate electrode 337 on the side connected to the resistor 303 becomes the off-state first.

A positive potential is given to the main gate electrode 341, and the IGBT cell with the main gate electrode 341 becomes the on-state.

An electron is given from the emitter electrode 339, and storage carriers are reduced by recombination.

A zero potential is given to the control gates electrode 337, and the IGBT provided with the control gates electrode 337 becomes the off-state. At that time, the IGBT provided with the main gate electrode 341 remains in the on-state.

FIG. 5 is a diagram illustrating a resistor section 350 according to one or more embodiments. The resistor section 350 receives the gate control signal 401 from the drive circuit 200 (not illustrated in FIG. 5). The resistor section 350 may include a gate pad 351. The resistor section 350 electrically connects the drive circuit 200 (not illustrated in FIG. 5) and the gate pad 351. The resistor section 350 includes a resistor 353 and a resistor 355. The resistor 353 has a plurality of resistors connected in parallel and includes a resistor 353a, a resistor 353b, and a resistor 353c. The resistors 353a, 353b, and 353c may have different resistance values. The resistor 355 has a plurality of resistors connected in parallel and includes a resistor 355a, a resistor 355b, and a resistor 355c. The resistors 355a, 355b, and 355c may have different resistance values. The resistor 353 and the resistor 355 are each connected in parallel with three resistors, but are not limited thereto. For example, the resistor 353 and the resistor 355 may have two, four, five, six, or more resistors connected in parallel. The resistor 353 and the resistor 355 may be formed on the surface side of the semiconductor substrate by wiring formed with polysilicon in a trench in which an S-shape is formed many times in a plan view. The resistor 353 receives the gate control signal 401 from the gate pad 351, and generates a control gate control signal 433. The resistor 355 receives the gate control signal 401 from the gate pad 351, and generates a main gate control signal 435.

Thus, the resistor 353 and the resistor 355 include a plurality of resistors including different resistance values. In general, a resistor with a small resistance value discharges faster, and a resistor with a large resistance value discharges slower. As a result, when connected to a resistor with a small resistance value, the control cell of the IGBT circuit 300 may be turned off quickly. On the other hand, when connected to a resistance with a large resistance value, the cell of the IGBT circuit 300 may be turned off late. The resistor 353 and the resistor 355 include a plurality of resistors including different resistance values. By using a resistor having an optimum resistance value, the cell of the IGBT circuit 300 may control the timing of turned off, and the decrease in the hole carrier density at the time of the conductivity modulation of the control gate may be controlled more. The hole carrier density may be lowered by turning off the main cell connected to the resistor 355 side.

A setting of resistance values of the resistor 353 and the resistor 355 with a plurality of resistors having different resistance values is described. For example, as illustrated in FIG. 5, a plurality of resistors may be built in at the time of manufacture. Regarding the plurality of resistors, a resistive part having a resistor for a desired control gate and a resistor for a main gate may be completed by a trimming process in which an excessive current is forcibly applied at an inspection stage of a wafer and a part of a circuit is melted down and made invalid. For example, in FIG. 5, the resistor 353 includes the resistor 353a, the resistor 353b, and the resistor 353c. However, the trimming process disables the resistor 353a and the resistor 353c, and enables the connection of only the resistor 353b. Also, the resistor 355 includes the resistor 355a, the resistor 355b, and the resistor 355c. However, the trimming process disables the resistor 353a and the resistor 353b, and enables the connection of only the resistor 353c. As a result, a more optimal resistance value is selected. As described above, by performing the trimming process, it may be easy to respond to the desired operating frequency of the IGBT in the end-use equipment while minimizing changes in conditions in the IGBT making process, changes in the glass mask, etc.

Although one or more embodiments as described above herein may be directed to devices having a particular arrangement of layers with conductivity types, e.g. types, e.g. N, N+, P, and so on, other embodiments may be directed to devices in which the conductivity types are reversed or otherwise modified. Furthermore, the above-described aspects may be combined with each other as practicable within the contemplated scope of embodiments. The above-described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention. Thus, all configurations including configurations that fall within equivalent arrangements of the claims are intended to be embraced in the invention.

The invention claimed is:
1. A semiconductor device, comprising:
   a semiconductor substrate including an active region and an inactive region, the active region, comprising:
      a drift region of a first conductivity type;
      a base region of a second conductivity type arranged on the drift region;
      an emitter region of the first conductivity type arranged on the base region;
      a field stop region of the first conductivity type arranged in contact with the drift region;

a collector region of the second conductivity type arranged in contact with the field stop region;

a main gate electrode electrically insulated from the base region, the main gate electrode is arranged in a first trench on a surface side of the semiconductor substrate, and comprises polysilicon; and the inactive region arranged on periphery of the active region, comprising:

a gate pad arranged on the drift region; and a first resistor electrically connected between the gate pad and the main gate electrode, the first resistor is arranged in a second trench on the surface side of the semiconductor substrate and comprises polysilicon with higher resistance than that of the main gate electrode.

2. The semiconductor device according to claim 1, wherein the active region comprises a control gate electrode electrically insulated from the base region, the control gate electrode is arranged in a third trench on the surface side of the semiconductor substrate, the control gate electrode comprises polysilicon, the inactive region comprises a second resistor electrically connected between the gate pad and the control gate electrode, the second resistor is arranged in a fourth trench on the surface side of the semiconductor substrate, and comprises polysilicon with higher resistance than that of the main gate electrode; and a resistance value of the first resistor is greater than the resistance value of the second resistor.

3. The semiconductor device according to claim 2, further comprising:

a breakdown voltage improvement region formed outside of the first resistor and the second resistor.

4. The semiconductor device according to claim 2, further comprising:

a drive circuit comprising a gate control signal generator connected to the gate pad and driving the semiconductor device.

5. The semiconductor device according to claim 2, wherein the second resistor comprises resistors that are connected in parallel, and at least one of the resistors are not connected to the gate pad.

6. The semiconductor device according to claim 1, wherein the first resistor comprises resistors that are connected in parallel, and at least one of the resistors are not connected to the gate pad.

* * * * *